United States Patent
Hong et al.

(10) Patent No.: US 11,137,425 B2
(45) Date of Patent: Oct. 5, 2021

(54) APPARATUS OF CURRENT MEASUREMENT HAVING VARIABLE TUNING PRECISION CAPABILITY

(71) Applicant: ITX-AI Co., Ltd., Seoul (KR)

(72) Inventors: Ki Chul Hong, Yongin-si (KR); Ki Seok Kim, Yongin-si (KR)

(73) Assignee: ITX-AI Co., Ltd., Seoul (KR)

(*) Notice: Subject to any disclaimer, the term of this patent is extended or adjusted under 35 U.S.C. 154(b) by 7 days.

(21) Appl. No.: 16/693,150

(22) Filed: Nov. 22, 2019

(65) Prior Publication Data
US 2020/0200803 A1 Jun. 25, 2020

(30) Foreign Application Priority Data

Nov. 22, 2018 (KR) .................... 10-2018-0145723

(51) Int. Cl.
*G01R 19/00* (2006.01)
*G01R 5/06* (2006.01)
*G01R 33/07* (2006.01)

(52) U.S. Cl.
CPC .......... *G01R 19/0092* (2013.01); *G01R 5/06* (2013.01); *G01R 33/07* (2013.01)

(58) Field of Classification Search
CPC ...... G01R 19/0092; G01R 5/06; G01R 33/07; G01R 33/072; G01R 33/0082; G01R 15/202; G01R 15/005; G01R 19/32; G01R 15/183

USPC .................. 324/76.11, 219, 220, 210, 207.2
See application file for complete search history.

(56) References Cited

U.S. PATENT DOCUMENTS

| | | | | |
|---|---|---|---|---|
| 3,707,677 A * | 12/1972 | Duncan | ............. | G01R 31/2614 324/756.06 |
| 10,416,249 B2 * | 9/2019 | Burger | ............. | G01R 33/3664 |
| 2008/0234574 A1 * | 9/2008 | Hancock | ............. | A61B 5/7264 600/430 |
| 2014/0084796 A1 * | 3/2014 | Yan | ............. | H05B 45/20 315/151 |
| 2015/0243432 A1 * | 8/2015 | Laifenfeld | ............. | G01R 27/02 324/601 |

* cited by examiner

*Primary Examiner* — Giovanni Astacio-Oquendo
(74) *Attorney, Agent, or Firm* — McCoy Russell LLP

(57) ABSTRACT

Provided is a current sensor having variable tuning precision capability depending on an amount of a current to be measured, a system state and the like. In the present disclosure, the current measurement apparatus having variable tuning precision capability does not separately require a current sensor measuring a small current with high precision and a current sensor stably measuring a large current without saturation. In the present disclosure, a single current measurement apparatus may vary current measurement precision depending on a current magnitude and the like, and may thus measure the small current with the high precision and stably measure the large current without saturation.

15 Claims, 4 Drawing Sheets

APPARATUS OF CURRENT MEASUREMENT HAVING VARIABLE TUNING PRECISION CAPABILITY

CROSS-REFERENCE TO RELATED APPLICATIONS

The present application claims priority to Korean Patent Application No. 10-2018-0145723 filed on Nov. 22, 2018. The entire contents of the above-listed application is hereby incorporated by reference for all purposes.

TECHNICAL FIELD

The following disclosure relates to a field of a current sensor, and more particularly, to a current sensor having variable tuning precision depending on an amount of a current to be measured, a system state and the like.

BACKGROUND

Current measurement apparatuses may include a hall sensor type current measurement apparatus which detects the strength of a magnetic field by installing a hall element in the magnetic field and measuring a voltage generated from the hall element.

The hall element may be a magnetic-electro transducer using a hall effect.

A hall voltage, i.e. an output voltage of the hall element, may be proportional to a hall sensor driving current and a magnetic flux density.

In a prior art document, a current to be measured may be calculated by constantly applying the hall sensor driving current and measuring the hall voltage depending on the magnetic flux density generated by the current to be measured. Here, a measurable maximum of the hall voltage may be limited by precision of a circuit of a hall voltage measurer and an analog to digital (A/D) converter. In general, an apparatus of the current measurement may thus have a measurable maximum current and current measurement precision in inverse proportion.

For example, when using the same n-bit A/D converter, a current measurement apparatus capable of measuring a current up to 1000 A may have a measurement error of about 1000/2n+1, whereas a current measurement apparatus capable of measuring a current up to 1 A may have a measurement error of about ½n+1. As such, there may be a big difference in the current measurement error, i.e. the current measurement precision, depending on a current measurement apparatus.

However, some applications may require higher measurement precision at a lower current rather than at a higher current.

In this case, it is conventional to employ a current measurement apparatus capable of measuring a maximum load current and another current measurement apparatus capable of measuring a low current with high precision. However, the number of current measurement apparatuses may be doubled.

SUMMARY

An embodiment in the present disclosure is directed to providing a current measurement apparatus capable of performing a reliable measurement of a current to be measured. Such a reliable measurement may be performed not only in such a manner that current measurement precision may be varied as necessary by controlling a current applied to a hall element and correcting an output voltage of the hall element based on the applied current, but also in such a manner that the current applied to the hall element is controlled by estimating a change in the current to be measured in advance in consideration of a system state, a current change rate, etc. In addition, the current measurement apparatus may have variable tuning precision capability with high current measurement reliability by allowing a single application specific integrated circuit (ASIC) to include a variable current source, a voltage measurer and a controller.

According to an embodiment in the present disclosure, a current measurement apparatus having variable tuning precision capability includes: a hall element provided in a gap formed in a core and outputting a hall voltage by a hall effect; a variable current source applying a current variably to an input terminal of the hall element; an output voltage measurer generating a signal based on the hall voltage which is an output voltage output from an output terminal of the hall element; and a controller including a corrector calculating a current to be measured based on an output signal of the output voltage measurer and then correcting the current to be measured based on at least one of an output current of the variable current source and temperature information of the hall element.

The variable current source may vary a magnitude of a current supplied to the input terminal of the hall element in N steps based on a current control signal.

To maintain a stable current measurement and to improve the current measurement precision, the current control signal may be determined based on at least one of a present state of the current to be measured, a past state of the current to be measured, state variables of a system including the current measurement apparatus, the temperature information of the hall element and a present current control signal.

The controller may include: a memory storing information on the current to be measured; and a control signal calculator calculating the current control signal at a next measurement time point based on at least one of the current control signal at the present time point, the information on the current to be measured, past information on the current to be measured stored in a storage and the temperature information of the hall element.

The controller may further include a communicator capable of communicating with an upper level controller, in which the control signal calculator may calculate the current control signal at a next measurement time point based on at least one of system information received from the upper level controller, the current control signal at the present time point, the temperature information of the hall element, the information on the current to be measured and the past information on the current to be measured stored in the storage.

The current control signal may be calculated based on a signal given by the upper level controller.

The current control signal may be calculated based on a lookup table using the current to be measured and a change rate of the current to be measured.

The current control signal may be calculated in such a manner that in the lookup table, the smaller an absolute value of the current to be measured, the larger a magnitude of the output current of the variable current source.

An upper limit of the current control signal may be set in such a manner that a maximum of the absolute value of the current to be measured is estimated based on at least one of the current to be measured, the change rate of the current to be measured and the state variables of the system, and then the estimated maximum of the absolute value of the current to be measured is included in a stably measurable current range by the current measurement apparatus.

Here, the stably measurable current range may refer to a range of the current to be measured in which the output voltage of the hall element depending on the current to be measured is within a measurable voltage range of the output voltage measurer.

In order to prevent the output current of the variable current source from becoming unstable depending on the change rate of the current to be measured, the current control signal may be set to a predetermined value in such a manner that when the absolute value of the current to be measured is smaller than a predetermined first reference value, the variable current source may output a constant current regardless of the change rate of the current to be measured.

A change period of the current control signal may be longer than a response delay time required for the variable current source to change the output current depending on a change of the current control signal.

The current measurement apparatus may further include: an input voltage measurer generating a signal based on a voltage applied at the input terminal of the hall element by the variable current source; and a temperature calculator obtaining an input resistance of the hall element from an input voltage measured by the input voltage measurer and the output current of the variable current source, and obtaining the temperature information of the hall element from the lookup table with respect to the obtained resistance.

To improve the current measurement reliability, a single application specific integrated circuit (ASIC) may include the controller, the variable current source and the output voltage measurer.

A system including the current measurement apparatus having at least one of the above features includes: the upper level controller receiving information on the current to be measured from the current measurement apparatus; and a load to which the current to be measured is applied, in which the upper level controller may transmit system information based on at least one of present state information and predicted state change information of the load and system operation information to the current measurement apparatus.

The load may be a motor, and the state information of the load may include at least one of speed information, torque information, magnetic flux information, speed command value information and torque command value information of the motor.

The system may be a moving object, and the system operation information may include at least one of speed information, acceleration pedal information, brake pedal information, acceleration and deceleration command information and shift information of the moving object.

In the system, the load may be an n-phase alternating current (AC) load and the current measurement apparatuses may be n current measurement apparatuses, in which the system may correct information on remaining n−m (i.e., n minus m) currents to be measured based on information on m currents to be measured with higher precision among information on n currents to be measured received from the n current measurement apparatuses under a condition of m<n.

Hereinafter, exemplary embodiments are illustrated to describe the present disclosure in more detail. However, it is to be understood that that such description of the embodiments is intended to only illustrate a practice of the present disclosure, and the present disclosure is not limited to the disclosed embodiments.

DETAILED DESCRIPTION OF EMBODIMENTS

Figure 1:
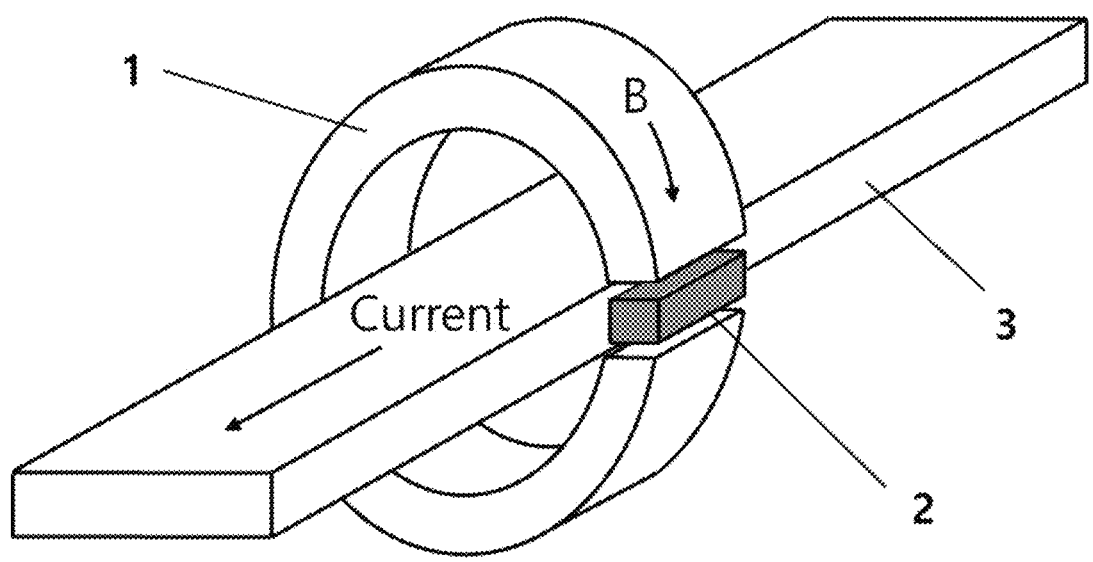
FIG. 1 illustrates an example of a hall element of a current measurement apparatus based on the hall element provided in a gap of a core to which the present disclosure is applied.

Various objects, advantages and features in the present disclosure become apparent from the following description of embodiments with reference to the accompanying drawings.

The following descriptions of specific structures and functions merely describe the embodiments based on a concept in the present disclosure. Therefore, the embodiments in the present disclosure may be implemented in various forms and the present disclosure is not limited thereto.

Since exemplary embodiments in the present disclosure may be variously modified based on a concept in the present disclosure and may have several forms, specific exemplary embodiments are shown in the accompanying drawings and described in detail in the present specification or disclosure. However, it is to be understood that the present disclosure is not limited to specific exemplary embodiments, but includes all modifications, equivalents, and substitutions included in the spirit and the scope of the present disclosure.

Terms such as 'first', 'second', etc. may be used to describe various components, but the components are not to be construed as being limited to the terms. The terms are used only to distinguish one component from another component. For example, a 'first' component may be named a 'second' component and the 'second' component may also be named the 'first' component, without departing from the scope in the present disclosure.

It is to be understood that when one component is referred to as being connected to or coupled to another component, it may be connected directly to or coupled directly to another component or be connected to or coupled to another component with the other component interposed therebetween. On the other hand, it is to be understood that when one component is referred to as being connected directly to or coupled directly to another component, it may be connected to or coupled to another component without the other component interposed therebetween. Other expressions to describe a relationship between the components, i.e., "between" and "directly between" or "adjacent to" and "directly adjacent to", should be interpreted in the same manner as above.

Terms used in the specification are used to describe specific embodiments, and are not intended to limit the disclosure. Singular forms used herein are intended to include plural forms unless explicitly indicated otherwise. It is to be understood that the terms "include", "have" and the like, used in the present specification specify the presence of features, numerals, steps, operations, components, parts or a combination thereof stated in the present specification, and do not preclude the presence or addition of one or more other features, numerals, steps, operations, components, parts, or a combination thereof.

Unless defined otherwise, it is to be understood that all the terms used in the present specification including technical and scientific terms have the same meanings as those that are generally understood by those skilled in the art. Terms generally used and defined in a dictionary are to be interpreted as the same meanings with meanings within the context of the related art, and are not to be interpreted as ideal or excessively formal meanings unless clearly indicated in the present specification.

Hereinafter, exemplary embodiments in the present disclosure are described in detail with reference to the accompanying drawings. Like reference numerals denote like components throughout the drawings.

As illustrated in FIG. 1, the present disclosure relates to a non-contact type current measurement apparatus including a core 1 and a hall element 2 which is provided in a gap between both ends of the core.

Figure 2:
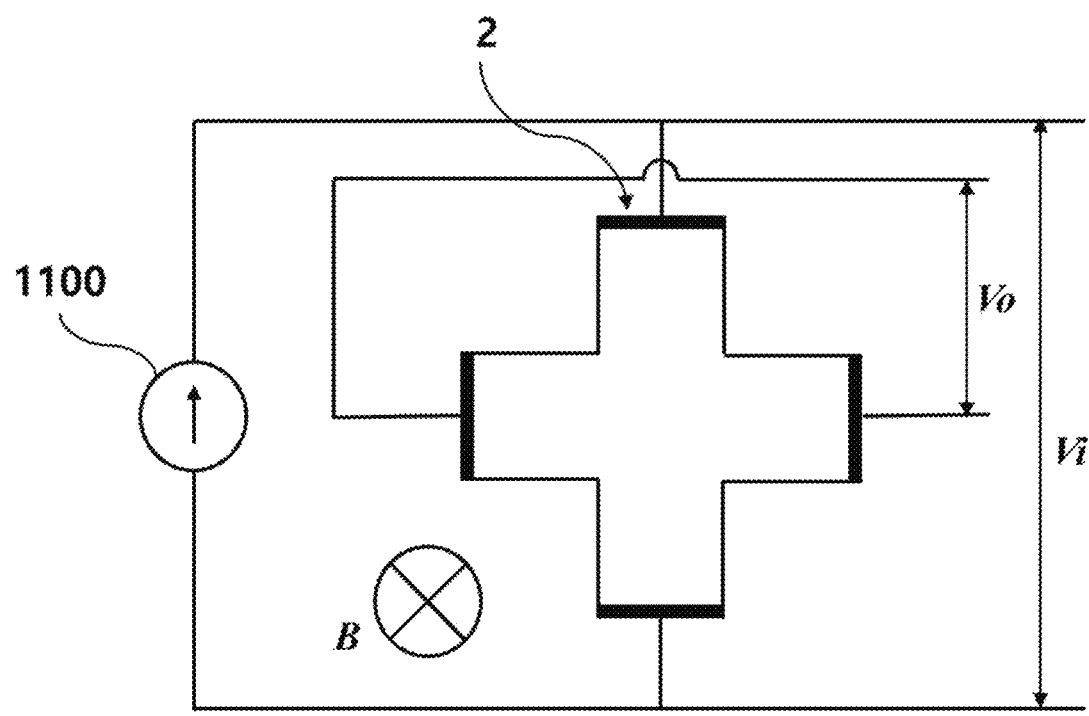
FIG. 2 illustrates a configuration of current input and voltage output of the hall element in the present disclosure.

As illustrated in FIG. 2, the hall element 2 may receive a constant current input and output a voltage depending on a peripheral magnetic field B through an output terminal as an output voltage Vo.

First Exemplary Embodiment

Figure 3:
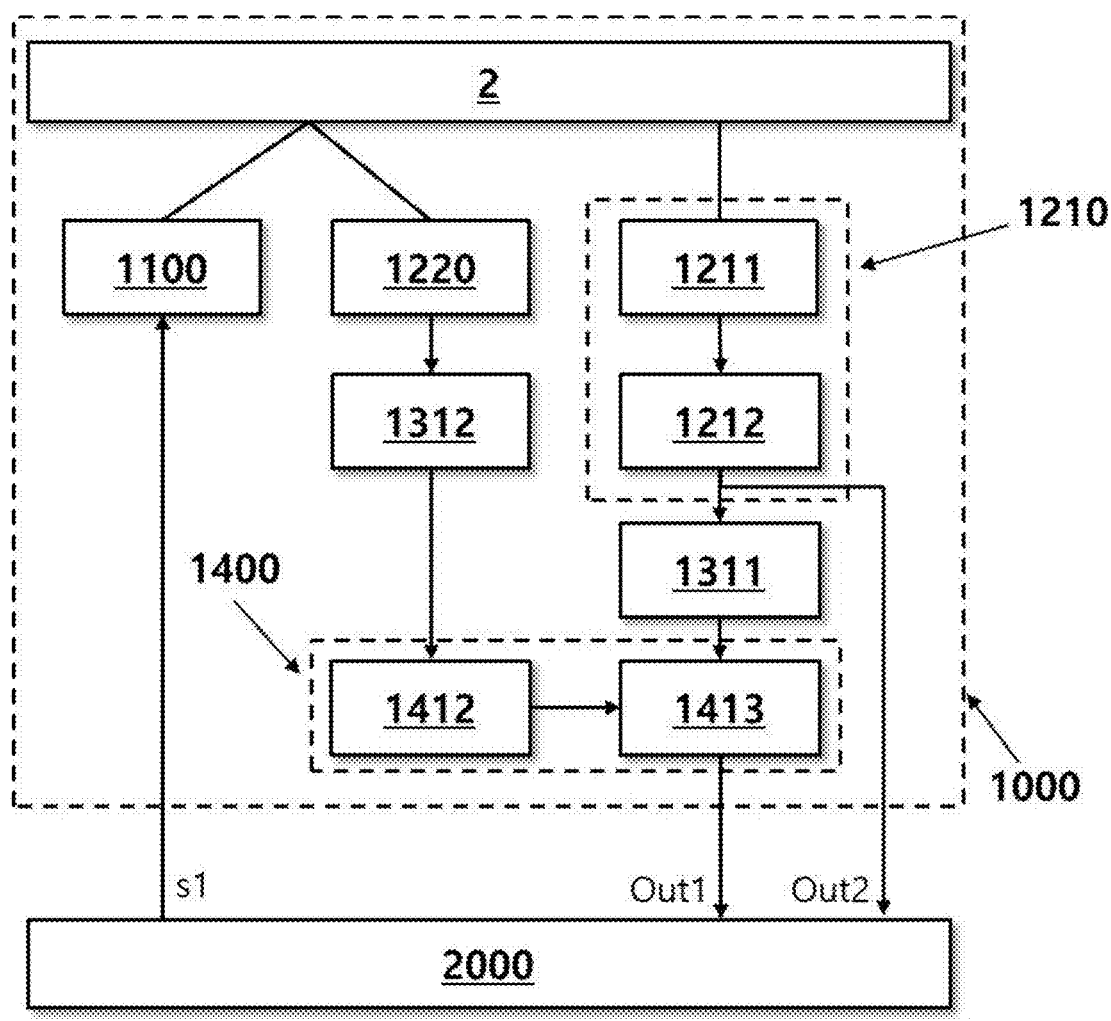
FIG. 3 illustrates an embodiment of a current measurement apparatus proposed in the present disclosure.
Figure 4:
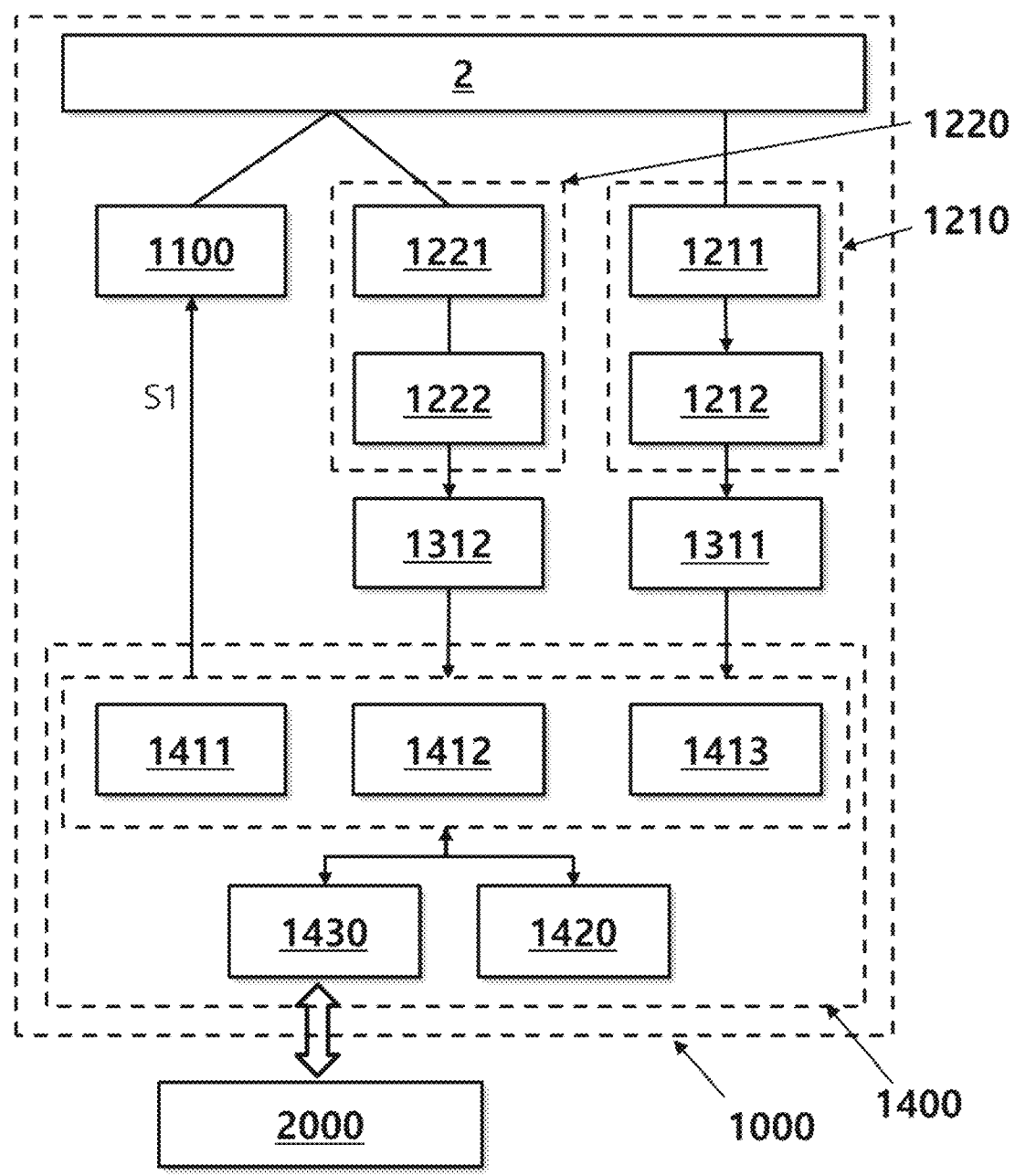
FIG. 4 illustrates another embodiment of a current measurement apparatus proposed in the present disclosure.

As illustrated in FIGS. 3 and 4, a current measurement apparatus having variable tuning precision capability may include: a hall element 2 provided in a gap formed in a core 1 and outputting a hall voltage by a hall effect; a variable current source 1100 applying a current variably to an input terminal of the hall element 2; an output voltage measurer 1210 generating a signal based on the hall voltage which is an output voltage output from an output terminal of the hall element 2; and a controller 1400 including a corrector 1413 calculating a current to be measured based on an output signal of the output voltage measurer 1210 and then correcting the current to be measured based on at least one of an output current of the variable current source 1100 and temperature information of the hall element.

Due to this feature, to measure one current, the current measurement apparatus in the present disclosure does not separately require a current sensor measuring a small current with high precision and another current sensor stably measuring a large current without saturation. In the present disclosure, a single current measurement apparatus may vary current measurement precision depending on a current magnitude and the like, and may thus measure the small current with the high precision and stably measure the large current without saturation.

The variable current source 1100 may vary a magnitude of a current supplied to the input terminal of the hall element 2 in N steps based on a current control signal S1.

To maintain a stable current measurement capability and to improve the current measurement precision, the current control signal S1 may be determined based on at least one of a present state of the current to be measured, a past state of the current to be measured, state variables of a system including the current measurement apparatus, the temperature information of the hall element and a present current control signal S1.

Second Exemplary Embodiment

As illustrated in FIG. 4, the controller 1400 may include: a memory 1420 storing information on the current to be measured; and a control signal calculator 1411 calculating the current control signal S1 at a next measurement time point based on at least one of the current control signal S1 at the present time point, the information on the current to be measured, past information on the current to be measured stored in the memory 1420 and the temperature information of the hall element.

Due to this feature, the current measurement apparatus in the present disclosure may estimate a future change in the current to be measured in advance in consideration of a current change amount by the apparatus itself, and may thus control the output current of the variable current source. Therefore, the apparatus in the present disclosure may prevent current measurement reliability from being degraded by an improper current measurement due to current measurement saturation occurring from a sudden current change.

Third Exemplary Embodiment

The controller 1400 may further include a communicator 1430 capable of communicating with an upper level controller 2000. Here, the control signal calculator 1411 may calculate the current control signal S1 at a next measurement time point based on at least one of system information received from the upper level controller 2000, the current control signal S1 at the present time point, the temperature information of the hall element, the information on the current to be measured and the past information on the current to be measured stored in the memory 1420.

Due to this feature, the apparatus in the present disclosure may not only transmit the information on the current to be measured to the upper level controller receiving information on the current, but may also receive the system information such as an acceleration schedule from the upper level controller and estimate a future change in the current to be measured in advance. In this manner, the apparatus in the present disclosure may control the output current of the variable current source, thereby more thoroughly preventing the current measurement reliability from being degraded by the sudden current change described above.

Fourth Exemplary Embodiment

As illustrated in FIG. 3, the current control signal S1 may be calculated based on a signal given by the upper level controller 2000.

Due to this feature, the upper level controller (e.g. an inverter controller) including a higher performance processor may perform an operation required for a current change rate and may then immediately generate the current control signal. Therefore, the current measurement apparatus in the present disclosure does not require any separate (high performance) processor, and may thus lower material costs.

Fifth Exemplary Embodiment

The current control signal S1 may be calculated based on a lookup table using the current to be measured and a change rate of the current to be measured.

The current control signal S1 may be calculated in such a manner that in the lookup table, the smaller an absolute value of the current to be measured, the larger a magnitude of the output current of the variable current source 1100.

An upper limit of the current control signal S1 may be set in such a manner that a maximum of the absolute value of the current to be measured is estimated based on at least one of the current to be measured, the change rate of the current to be measured and the state variables of the system, and then the estimated maximum of the absolute value of the current to be measured is included in a current range stably measured by the current measurement apparatus.

In addition, in order to prevent the output current of the variable current source 1100 from becoming unstable depending on the change rate of the current to be measured, the current control signal S1 may be set to a predetermined value in such a manner that when the absolute value of the current to be measured is smaller than a predetermined first reference value, the variable current source 1100 may output a constant current regardless of the change rate of the current to be measured.

Due to this feature, when measuring the small current, the apparatus in the present disclosure may prevent a significant change in the current of the variable current source due to a high current change rate even with a small current change.

Sixth Exemplary Embodiment

In addition, a change period of the current control signal S1 may be longer than a response delay time required for the variable current source 1100 to change the output current depending on a change of the current control signal S1.

Seventh Exemplary Embodiment

The current measurement apparatus may further include: an input voltage measurer 1220 generating a signal based on a voltage applied at the input terminal of the hall element 2 by the variable current source 1100; and a temperature calculator 1412 obtaining an input resistance of the hall element from an input voltage measured by the input voltage measurer 1220 and the output current of the variable current source 1100, and obtaining the temperature information of the hall element from the lookup table based on the obtained resistance.

Due to this feature, the temperature of the hall element may be estimated using the input resistance of the hall element. Therefore, the current measurement apparatus in the present disclosure may be installed away from the hall element, and thereby being prevented in advance from having an increased temperature.

Eighth Exemplary Embodiment

To improve the current measurement reliability, a single application specific integrated circuit (ASIC) may include the controller 1400, the variable current source 1100 and the output voltage measurer 1210.

Due to this feature, the apparatus in the present disclosure may allow the single ASIC to include all of the variable current source, the current measurer and the controller, thereby preventing the current measurement reliability from being degraded by variable precision. That is, the current measurement reliability may be significantly deteriorated in case that information on the current supplied to the hall element by the variable current source and information for correcting the output voltage of the hall element measured by the voltage measurer do not match each other due to time delay, noise contamination or the like. However, the apparatus in the present disclosure may minimize the above reliability degradation by allowing the ASIC to include all of the variable current source, the voltage measurer and the controller.

Ninth Exemplary Embodiment

A system including the current measurement apparatus having at least one of the above features may include: the upper level controller 2000 receiving information on the current to be measured from the current measurement apparatus; and a load to which the current to be measured is applied, in which the upper level controller 2000 may transmit system information based on at least one of present state information and predicted state change information of the load and system operation information to the current measurement apparatus.

Tenth Exemplary Embodiment

The load may be a motor, and the state information of the load may include at least one of speed information, torque information, magnetic flux information, speed command value information and torque command value information of the motor.

Eleventh Exemplary Embodiment

The system may be a moving object, and the system operation information may include at least one of speed information, acceleration pedal information, brake pedal information, acceleration and deceleration command information and shift information of the moving object.

Twelfth Exemplary Embodiment

In the system, the load may be an n-phase alternating current (AC) load and the current measurement apparatus may be n current measurement apparatuses, and the system may correct information on the remaining n−m (i.e., n minus m) currents to be measured based on information on m currents to be measured with higher precision among information on n currents to be measured received from the n current measurement apparatuses under a condition of m<n.

Due to this feature, an n-phase system using a plurality of current measurement apparatuses proposed in the present disclosure may use m phase currents measured at low currents and with high precision to improve precision of remaining n−m (i.e., n minus m) phase currents.

For example, in a three-phase system, zero (0) is a sum of currents in the first to third phases. Therefore, in case that the current in the first phase is very large, the currents in the second and third phases may be smaller than that is the first phase. Here, the currents in the second and third phases may be measured with increased precision. Accordingly, it is possible to improve precision in the current measurement of the first phase using the currents in the second and third phases measured with high precision and a zero sum of the currents in the first to third phases.

As described above, the apparatus in the present disclosure may have the following effects:

(1) The apparatus may stably perform the current measurement.

(2) The apparatus may perform the current measurement with increased precision.

(3) To measure one current, the apparatus does not separately require the current sensor measuring the small current with the high precision and another current sensor stably measuring the large current without saturation. In the present disclosure, the single current measurement apparatus may vary the current measurement precision depending on the current magnitude and the like, and may thus measure the small current with the high precision and stably measure the large current without saturation.

(4) The apparatus may allow the single ASIC to include all of the variable current source, the current measurer and the controller, thereby preventing the current measurement reliability from being degraded by the variable precision.

(5) In more detail, the current measurement reliability may be significantly deteriorated in case that the information on the current supplied to the hall element by the variable current source and the information for correcting the output voltage of the hall element measured by the voltage measurer do not match each other due to the time delay, noise contamination or the like. However, the apparatus may minimize the above reliability degradation by allowing the ASIC to include all of the variable current source, the voltage measurer and the controller.

(6) The current measurement reliability may be degraded by the improper current measurement due to the current measurement saturation occurring from the sudden current change. However, the apparatus may prevent the current measurement reliability from being degraded by estimating the future change in the current to be measured in advance in consideration of the current change amount by the apparatus itself, and thus by controlling the output current of the variable current source.

(7) In addition, the apparatus may not only transmit the information on the current to be measured to the upper level controller receiving the information on the current, but may also receive the system information such as the acceleration schedule from the upper level controller and estimate the future change in the current to be measured in advance. In this manner, the apparatus may control the output current of the variable current source, thereby more thoroughly preventing the current measurement reliability from being degraded by the sudden current change described above.

(8) An n-phase system using the plurality of current measurement apparatuses proposed in the disclosure may use the m phase currents measured at the low currents and with the high precision to improve the precision of the remaining n–m (i.e., n minus m) phase currents.

(9) The temperature of the hall element may be estimated using the input resistance of the hall element. Therefore, the apparatus may be installed away from the hall element, and thereby being prevented in advance from having the increased temperature.

Although the present disclosure is shown and described with respect to specific embodiments, it is apparent to those having ordinary skill in the art that the present disclosure may be variously modified and altered without departing from the spirit and scope of the present disclosure as defined by the following claims.

The invention claimed is:

1. A current measurement apparatus having variable tuning precision capability, the apparatus comprising:
a hall element provided in a gap formed in a core and outputting a hall voltage by a hall effect;
a variable current source applying a current variably to an input terminal of the hall element;
an output voltage measurer generating a signal based on the hall voltage which is an output voltage output from an output terminal of the hall element; and
a controller including a corrector calculating a current to be measured based on an output signal of the output voltage measurer and then correcting the current to be measured based on at least one of an output current of the variable current source and temperature information of the hall element.

2. The current measurement apparatus of claim 1, wherein the variable current source varies a magnitude of a current supplied to the input terminal of the hall element in N steps based on a current control signal.

3. The current measurement apparatus of claim 2, wherein to maintain a stable current measurement and to improve the current measurement precision, the current control signal is determined based on at least one of a present state of the current to be measured, a past state of the current to be measured, state variables of a system including the current measurement apparatus, the temperature information of the hall element and a present current control signal.

4. The current measurement apparatus of claim 3, wherein the controller includes:
a memory storing information on the current to be measured; and
a control signal calculator calculating the current control signal at a next measurement time point based on at least one of the current control signal at the present time point, the information on the current to be measured, past information on the current to be measured stored in the memory and the temperature information of the hall element.

5. The current measurement apparatus of claim 4, wherein the controller further includes a communicator capable of communicating with an upper level controller, wherein the control signal calculator calculates the current control signal at a next measurement time point based on at least one of system information received from the upper level controller, the current control signal at the present time point, the temperature information of the hall element, the information on the current to be measured and the past information on the current to be measured stored in the memory.

6. The current measurement apparatus of claim 3, wherein the current control signal is calculated based on a signal given by the upper level controller.

7. The current measurement apparatus of claim 3, wherein the current control signal is calculated based on a lookup table using the current to be measured and a change rate of the current to be measured.

8. The current measurement apparatus of claim 7, wherein the current control signal is calculated in such a manner that in the lookup table, the smaller an absolute value of the current to be measured, the larger a magnitude of the output current of the variable current source.

9. The current measurement apparatus of claim 8, wherein an upper limit of the current control signal is set in such a manner that a maximum of the absolute value of the current to be measured is estimated based on at least one of the current to be measured, the change rate of the current to be measured and the state variables of the system, and then the estimated maximum of the absolute value of the current to be measured is included in a current range stably measured by the current measurement apparatus.

10. The current measurement apparatus of claim 3 further comprising:
an input voltage measurer generating a signal based on a voltage applied at the input terminal of the hall element by the variable current source; and
a temperature calculator obtaining an input resistance of the hall element from an input voltage measured by the input voltage measurer and the output current of the variable current source, and obtaining the temperature information of the hall element from the lookup table with respect to the obtained resistance.

11. The current measurement apparatus of claim 1, wherein to improve the current measurement reliability, a single application specific integrated circuit (ASIC) includes the controller, the variable current source and the output voltage measurer.

12. A system including the current measurement apparatus of claim 1, the system comprising:
an upper level controller receiving information on the current to be measured from the current measurement apparatus; and
a load to which the current to be measured is applied,
wherein the upper level controller transmits system information based on at least one of present state information and predicted state change information of the load and system operation information to the current measurement apparatus.

13. The system of claim 12, wherein the load is a motor, and the state information of the load includes at least one of speed information, torque information, magnetic flux information, speed command value information and torque command value information of the motor.

14. The system of claim 12, wherein the system is a moving object, and the system operation information includes at least one of speed information, acceleration pedal information, brake pedal information, acceleration and deceleration command information or shift information and the moving object.

15. The system of claim 12,
wherein the load is an n-phase alternating current (AC) load and the current measurement apparatuses are n current measurement apparatuses, and
the system corrects information on remaining n−m (i.e., n minus m) currents to be measured based on information on m currents to be measured with higher precision among information on n currents to be measured received from the n current measurement apparatuses under a condition of m<n.

* * * * *